(12) United States Patent
Ohtsuka et al.

(10) Patent No.: US 6,781,865 B2
(45) Date of Patent: Aug. 24, 2004

(54) NONVOLATILE SELECTOR, AND INTEGRATED CIRCUIT DEVICE

(75) Inventors: Takashi Ohtsuka, Toyonaka (JP); Kiyoyuki Morita, Yawata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/398,737

(22) PCT Filed: Jun. 6, 2002

(86) PCT No.: PCT/JP02/05631

§ 371 (c)(1),
(2), (4) Date: Apr. 9, 2003

(87) PCT Pub. No.: WO02/101928

PCT Pub. Date: Dec. 19, 2002

(65) Prior Publication Data

US 2004/0095181 A1 May 20, 2004

(30) Foreign Application Priority Data

Jun. 6, 2001 (JP) ........................................ 2001-170582

(51) Int. Cl.[7] .............................................. G11C 11/22
(52) U.S. Cl. .......................... 365/145; 365/149; 365/104
(58) Field of Search ................................ 365/145, 149, 365/104, 117, 164

(56) References Cited

U.S. PATENT DOCUMENTS

| | | | | |
|---|---|---|---|---|
| 5,615,145 A | * | 3/1997 | Takeuchi et al. | 365/145 |
| 5,629,888 A | * | 5/1997 | Saito et al. | 365/145 |
| 5,768,176 A | * | 6/1998 | Katoh | 365/145 |
| 6,094,369 A | | 7/2000 | Ozawa et al. | |
| 6,094,371 A | * | 7/2000 | Fukuda | 365/145 |
| 6,233,169 B1 | | 5/2001 | Nishimura | |

FOREIGN PATENT DOCUMENTS

| | | |
|---|---|---|
| EP | 536094 | 4/1993 |
| JP | 6-104717 | 4/1994 |
| JP | 7-177009 | 7/1995 |
| JP | 9-312558 | 12/1997 |
| JP | 11-17123 | 1/1999 |
| JP | 2000-323671 | 11/2000 |
| WO | WO 97/39528 | 10/1997 |

* cited by examiner

*Primary Examiner*—Thong Le
(74) *Attorney, Agent, or Firm*—McDermott Will & Emery LLP

(57) ABSTRACT

A multiplexer includes first through fourth switching sections 10A through 10D in a pre-stage gate and each of the switching sections 10 includes a serial capacitor 3 and a FET 4. The serial capacitor 3 includes a ferroelectric capacitor 1 and a paraelectric capacitor 2 and an intermediate node of the serial capacitor 3 is connected to a gate electrode 8 of the FET 4. In a unit selector Use11 made up of the switching sections 10A and 10B, a voltage applied to the intermediate node 9 is distributed according to the difference between the capacitances of the two capacitors so that in the switching section 10A and 10B, the FETs 4 alternately turn ON and OFF according to the logical value, 1 or 0, of a selection signal D1. Accordingly, an operation state is stored in a nonvolatile state in the ferroelectric capacitor 1.

10 Claims, 13 Drawing Sheets

| D1 | D2 | Out |
|----|----|-----|
| 0  | 0  | In4 |
| 0  | 1  | In2 |
| 1  | 0  | In3 |
| 1  | 1  | In1 |

| D1 | D2 | Out |
|----|----|-----|
| 0  | 0  | In4 |
| 0  | 1  | In2 |
| 1  | 0  | In3 |
| 1  | 1  | In1 |

NONVOLATILE SELECTOR, AND INTEGRATED CIRCUIT DEVICE

TECHNICAL FIELD

The present invention relates to selectors for use in various logic circuits and integrated circuit devices including such circuits and more particularly relates to a selector with a nonvolatile memory function and an IC circuit device including such a selector.

BACKGROUND ART

Multiplexers and demultiplexers are basic logic circuits for MISFETs that have been widely used in recent years. Multiplexers and demultiplexers, also referred to as "selection circuits" and "distribution circuits", are circuits for selecting input data according to selection signals and circuits for distributing input data according to selection signals, respectively.

FIGS. 14(a) and 14(b) are an electric circuit diagram of a known 4-input multiplexer and a table showing the input-output relation in the multiplexer in accordance with selection signals, respectively. As shown in FIG. 14(a), the known multiplexer includes: four pre-stage-side NMISFETs 1001 through 1004 for receiving four input signals In1, In2, In3 and In4, respectively; a subsequent-stage-side NMISFET 1005 for receiving outputs from the two pre-stage-side NMISFETs 1001 and 1002; a subsequent-stage-side NMISFET 1006 for receiving outputs from the two pre-stage-side NMISFETs 1003 and 1004; an output terminal 1007 for receiving outputs from the two subsequent-stage-side NMISFETs 1005 and 1006; a pre-stage-side SRAM 1011 for supplying a selection signal D1 to the two pre-stage-side MISFETs 1001 and 1003 and an inverted selection signal /D1 to the two pre-stage-side MISFETs 1002 and 1004; and an SRAM 1012 for supplying a selection signal D2 to the subsequent-stage-side MISFET 1005 and an inverted selection signal /D2 to the subsequent-stage-side MISFET 1006.

As shown in FIG. 14(b), any one of the input signals In1 through In4 is uniquely selected as an output signal Out according to the four different combinations of the logical values of the selection signals D1 and D2. In other words, the output signal Out is changed in one-to-one correspondence with the combinations of the selection signals D1 and D2.

A demultiplexer, on the other hand, operates in the opposite input-output relation to the mutipleplexer. Specifically, assuming that the input signals In1 through In4 are input from the output terminal 1007, one of the input signals In1 through In4 is uniquely output from one of the corresponding input terminals to the input signals In1 through In4 shown in FIG. 14(a), according to the four types of data of the selection signals D1 and D2.

Problems that the Invention is to Solve

As has been described, in the known multiplexer, control data is pre-stored in an SRAM (FF) and multiplex operation is carried out according to the content of the pre-stored data. Accordingly, when data in the SRAM is retained, i.e., in the state where power is ON in a circuit, the operation of the multiplexer is carried out in accordance with the stored content in the SRAM. After power has been turned OFF, however, in order to carry out operation of the multiplexer, means for storing data in the SRAM is needed.

It is also possible to store the data that have been stored in the SRAM in a nonvolatile memory such as a flash memory and download the data stored in the nonvolatile memory to the SRAM of the mutiplexer in operating the multiplexer. This, however, additionally requires a nonvolatile memory and a download operation.

As for portable devices that have been widely used in recent years, considering power supply, such as batteries, and power consumption, the function of storing operation in a nonvolatile state is required. If a device is provided with only the function of storing data in a volatile state, data at power-on has to be re-downloaded.

When a circuit such as multiplexer is applied to a neuro device which carries out arithmetic operations and learning using previously processed data, stored contents being volatile also come into question.

Then, the present inventors made attempts to configure a circuit, such as a multiplexer, by using a device with a nonvolatile memory function.

Flash memories and ferroelectric memories (FRAMs) have been out in the market as typical devices having a nonvolatile memory function. Specifically, there have been proposed MFSFETs (metal ferroelectric semiconductor FETs), MFMSFETs (metal ferroelectric metal semiconductor FETs), and MFMISFETs (metal ferroelectric metal insulator semiconductor FETs) (which will be hereinafter referred to as "MFS-type-FETs") each of which can be obtained by forming a gate insulating film from a ferroelectric film in a MISFET (metal insulator semiconductor field effect transistor). Such a MFS-type-FET is expected to function as a small-scaled nonvolatile memory that is operable at high speed.

The MFS-type-FETs utilize the fact that when a higher voltage than the coercive electric field of a ferroelectric material is applied between the semiconductor substrate and a gate electrode, the polarization of a ferroelectric film is changed and residual dielectric polarization occurs in the ferroelectric film even after the application of a voltage has been stopped. More specifically, a MFS-type-FET turns in a normal ON state or a normal OFF state depending on the direction of the residual dielectric polarization, and then an ON/OFF difference in the FET is stored as information.

However, to cause inversion in polarization in a ferroelectric film, application of a voltage between a gate and a semiconductor substrate is necessary. When 2-value logic values L (0V) and H (supply voltage VDD) for use in regular logic devices are used, application of a reverse field between a substrate and a gate electrode is required in order to reverse the residual dielectric polarization in the ferroelectric film. This results in a problem that the device configuration becomes complex.

DISCLOSURE OF INVENTION

An object of the present invention is to provide a nonvolatile selector which includes a ferroelectric film and utilizes a FET having a simple configuration different from that of a known MFSFET to carry out a nonvolatile operation for selecting a signal, and to provide an integrated circuit device using such a selector.

A nonvolatile selector which includes at least one unit selector and, according to a selection signal and an inverted selection signal, blocks at least one input signal of a plurality of input signals and passes the other signals, characterized in that the unit selector includes: at least one serial capacitor that includes a first capacitor and a second capacitor which are connected to each other in series with an intermediate node located therebetween and at least one of which is a ferroelectric capacitor, and receives the selection signal and the inverted selection signal at both ends, respectively; a first FET including a gate electrode connected to the intermediate node of the serial capacitor, and first and second impurity doped layers functioning as an input section and an output section, respectively; and a second FET including a gate electrode connected to the intermediate node of the serial capacitor, and first and second impurity doped layers functioning as an input section and an output section, respectively, and when the selection signal and the inverted selection signal are received at both ends of the serial capacitor, the potential at the intermediate node is varied according to the logical value of the inverted selection signal so that one of the first and second FETs turns ON and the other turns OFF.

In the unit selector, assume that when the logical value of a selection signal is 1, the first FET and the second FET turns ON and OFF, respectively, according to the potential of the intermediate node. When the logical value of the selection signal is 0, the first FET and the second FET turns OFF and ON, respectively, according to the potential of the intermediate node. Thus, the selector function can be ensured. Since the potential of the intermediate node is maintained by residual dielectric polarization, a selector having the nonvolatile memory function as well as a simple device structure can be achieved.

If first and second serial capacitors are provided as said at least one serial capacitor, the intermediate node of the first serial capacitor is connected to the gate electrode of the first FET, the intermediate node of the second serial capacitor is connected to the gate electrode of the second FET, the first and second FETs have the same conductivity type, the first capacitor of the first serial capacitor and the second capacitor of the second serial capacitor are connected to each other via a common first line, the second capacitor of the first serial capacitor and the first capacitor of the second serial capacitor are connected to each other via a common second line, and the selection signal or the inverted selection signal is supplied via the first line while the inverted selection signal or the selection signal is supplied via the second line, high-speed operation can be achieved by using, for example, only an n-channel FET.

In that case, if the first and second capacitors in each of the first and second serial capacitors are a pair of ferroelectric capacitors that include respective ferroelectric films having different hysteresis characteristics of polarization depending upon applied voltages, the nonvolatile memory function can be achieved more reliably.

If the respective capacitance values of the ferroelectric capacitors of each said pair in the first and second serial capacitors differ from each other according to the difference between the thicknesses of the ferroelectric films formed of the same material, this simplifies process steps while preventing an increase in the area occupied.

If the respective capacitance values of the ferroelectric capacitors of each said pair in the first and second serial capacitors differ from each other according to the difference between the areas of the ferroelectric films formed of the same material, designing can be easier and the number of process steps can be reduced.

One of the first and second capacitors of each of the first and second serial capacitors may be a ferroelectric capacitor and the other may be a paraelectric capacitor.

If the inventive nonvolatile selector further includes another unit selector and said another unit selector includes: another first FET including a gate electrode connected to the intermediate node of the first serial capacitor, and first and second impurity doped layers functioning as an input section and an output section, respectively, and another second FET including a gate electrode connected to the intermediate node of the second serial capacitor, and first and second impurity doped layers functioning as an input section and an output section, respectively, the number of serial capacitors in the nonvolatile selector can be reduced. Accordingly, a nonvolatile selector with a small area occupied can be achieved.

If a serial capacitor is provided as said at least one serial capacitor, and one of the first and second FETs is an n-channel FET and the other is a p-channel FET, the number of serial capacitors can be reduced in every unit selector, resulting in a nonvolatile selector with a still smaller area occupied.

If the first and second capacitors in the serial capacitor are a pair of ferroelectric capacitors that include respective ferroelectric films having different hysteresis characteristics of polarization depending upon applied voltages, the nonvolatile memory function can be obtained more reliably.

One of the first and second capacitors of the serial capacitor may be a ferroelectric capacitor and the other may be a paraelectric capacitor.

If a nonvolatile selector further includes a gate section which includes $2^{n-1}$ (n is a natural number as great as or greater than 2) pairs of the first and second FETs that receive $2^n$ input signals and in which $2^{n-1}$ unit selectors that receives common selection and inverted selection signals at both ends of the serial capacitors are disposed, an operation state of one gate section can be stored in a volatile state.

If a plurality of the gate sections are disposed such that the number of the unit selectors in each subsequent-stage section is reduced to half that in the previous-stage gate section, the multiplexer function can be ensured.

If a serial capacitor that includes a first capacitor and a second capacitor which are disposed at the output side in the final-stage gate section of the gate sections and connected to each other in series with an intermediate node located therebetween and at least one of which is a ferroelectric capacitor and, receives the output signal and the inverted output signal at both ends, respectively, operation can be started at the next power-on in the same state as at the time when the power supply has been cut.

A semiconductor integrated circuit according to the present invention is a semiconductor integrated circuit including a selector that includes at least one unit selector and, according to a selection signal and an inverted selection signal, blocks at least one input signal of a plurality of input signals and passes the other signals, in which the unit selector includes: at least one serial capacitor that includes a first capacitor and a second capacitor which are connected to each other in series with an intermediate node located therebetween and at least one of which is a ferroelectric capacitor, and receives the selection signal and the inverted selection signal at both ends, respectively; a first FET including a gate electrode connected to the intermediate node of the serial capacitor, and first and second impurity doped layers functioning as an input section and an output section, respectively; and a second FET including a gate electrode connected to the intermediate node of the serial capacitor, and first and second impurity doped layers functioning as an input section and an output section, respectively, and when the selection signal and the inverted selection signal are received at both ends of the serial capacitor, the potential at the intermediate node is varied according to the logical value of the inverted selection signal so that one of the first and second FETs turns ON and the other turns OFF, and the semiconductor integrated circuit functions as an FPGA (field programmable gate-array), or is disposed in a recognition system or an encryption chip circuit.

With the inventive semiconductor integrated circuit, the need to dispose an additional memory such as an SRAM for storing various data and then latch the stored data is eliminated, and thus the configuration and control of a circuit can be simplified.

BEST MODE FOR CARRYING OUT THE INVENTION

Hereinafter, the operation of nonvolatile multiplexers according to embodiments of the present invention will be described with reference to the accompanying drawings.

—First Embodiment—

Figure 1:
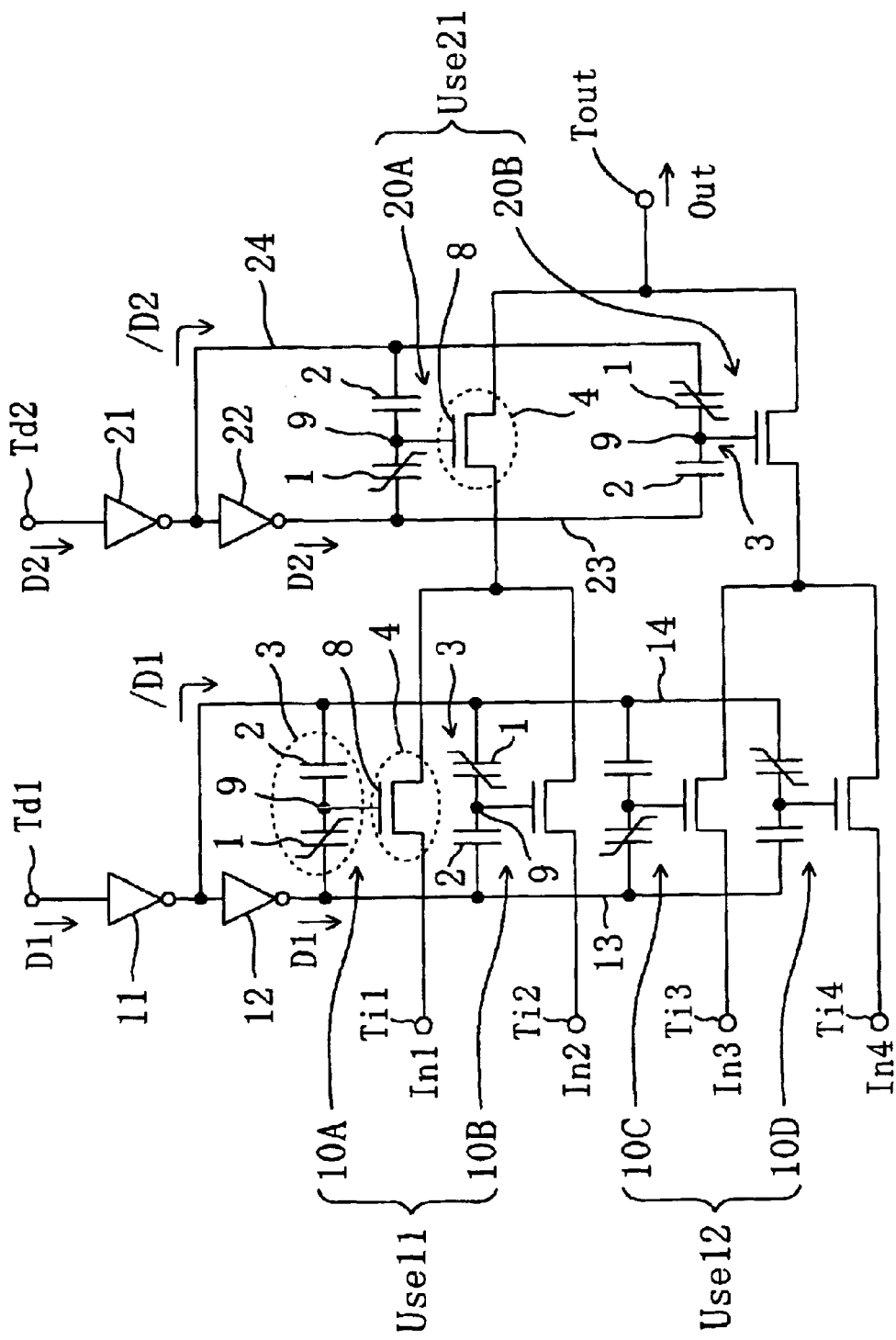
FIG. 1 is a circuit diagram of a nonvolatile multiplexer that is a nonvolatile selector in accordance with a first embodiment.

FIG. 1 is a circuit diagram of a nonvolatile multiplexer that is a nonvolatile selector in accordance with a first embodiment.

As shown in FIG. 1, the multiplexer of this embodiment is configured so as to receive four input signals In1 through In4 from four respective input terminals Ti1 through Ti4 and to output from an output terminal Tout, as an output signal Tout, a signal selected from the four input signals In1 through In4 according to selection signals D1 and D2 received from two control terminals Td1 and Td2. A pre-stage gate for selecting two input signals from the four input signals includes first through fourth switching sections 10A through 10D for switching their states to pass or block input signals. Each of the switching sections 10 includes a serial capacitor 3 and an n-channel FET 4. The serial capacitor 3 includes a ferroelectric capacitor 1 as a first capacitor (high-capacitance-side capacitor) and a paraelectric capacitor 2 as a second capacitor (low-capacitance-side capacitor), which are connected in series with each other via an intermediate node 9. A gate electrode 8 in the FET 4 is connected to the intermediate node 9.

The pre-stage gate includes a first inverter 11 that receives a selection signal D1 and then generates an inverted selection signal /D1, and a second inverter 12 that receives an inverted selection signal /D1 from the first inverter 11 and then generates a selection signal D1. The inverted selection signal /D1 output from the first inverter 11 is transmitted to the respective serial capacitors 3 of all of the switching sections 10A through 10D via a signal line 14, and the selection signal D1 output from the second inverter 12 is transmitted to the respective serial capacitors 3 of all of the switching sections 10A through 10D via a signal line 13. That is to say, the selection signal D1 and the inverted selection signal /D1 are applied to both ends of each of the serial capacitors 3, respectively In this case, in the pre-stage gate, the first and second switching sections 10A and 10B make up a unit selector Use11 and the third and fourth switching sections 10C and 10D make up a unit selector Use12. In the switching section 10A which is one of the two switching sections of the unit selector Use11, the selection signal D1 is applied to the ferroelectric capacitor 1 and the inverted selection signal /D1 is applied to the paraelectric capacitor 2. In the switching section 10B which is the other switching section of the unit selector Use11, on the other hand, the selection signal D1 is applied to the paraelectric capacitor 2 and the inverted selection signal /D1 is applied to the ferroelectric capacitor 1. In the same manner, in the switching section 10C which is one of the two switching sections of the unit selector Use12, the selection signal D1 is applied to the ferroelectric capacitor 1 and the inverted selection signal /D1 is applied to the paraelectric capacitor 2. In the switching section 10D which is the other switching section of the unit selector Use12, on the other hand, the selection signal D1 is applied to the paraelectric capacitor 2 and the inverted selection signal /D1 is applied to the ferroelectric capacitor 1. That is to say, in either unit selector Use11 or Use12, a voltage applied to one switching section's ferroelectric capacitor has the opposite polarity to that of a voltage applied to the other switching section's ferroelectric capacitor.

Moreover, a subsequent-stage gate includes a first inverter 21 that receives a selection signal D2 and then generates an inverted selection signal /D2 and a second inverter 22 that receives an inverted selection signal /D2 from the first inverter 21 and then generates a selection signal D2. The inverted selection signal /D2 output from the first inverter 21 is transmitted to the respective serial capacitors 3 of all of the switching sections 20A and 20B via a signal line 23. The selection signal D2 output from the second inverter 22 is transmitted to the respective serial capacitors 3 of all of the switching sections 20A and 20B via a signal line 24. That is to say, the selection signal D2 and the inverted selection signal /D2 are applied to both ends of the serial capacitors 3, respectively. In the subsequent-stage gate, the two switching sections 20A and 20B make up a unit selector Use21. In the switching section 20A which is one of the two switching sections of the unit selector Use21, the selection signal D2 is applied to the ferroelectric capacitor 1 and the inverted selection signal /D2 is applied to the paraelectric capacitor 2. In the switching section 20B which is the other switching section of the unit selector Use21, on the other hand, the selection signal D2 is applied to the paraelectric capacitor 2 and the inverted selection signal /D2 is applied to the ferroelectric capacitor 1. That is to say, also in the unit selector of the subsequent-stage gate, a voltage applied to one switching section's ferroelectric capacitor has the opposite polarity to that of a voltage applied to the other switching section's ferroelectric capacitor.

As has been described, the nonvolatile multiplexer of this embodiment has the configuration in which the unit selectors Use11 and Use12 are disposed in the pre-stage gate and the unit selector Use21 is disposed in the subsequent-stage gate. "Unit selector" herein means a selector having the function of selecting an input signal out of two input signals.

Hereinafter, the function of each of the unit selectors of this embodiment will be described.

Figure 2:
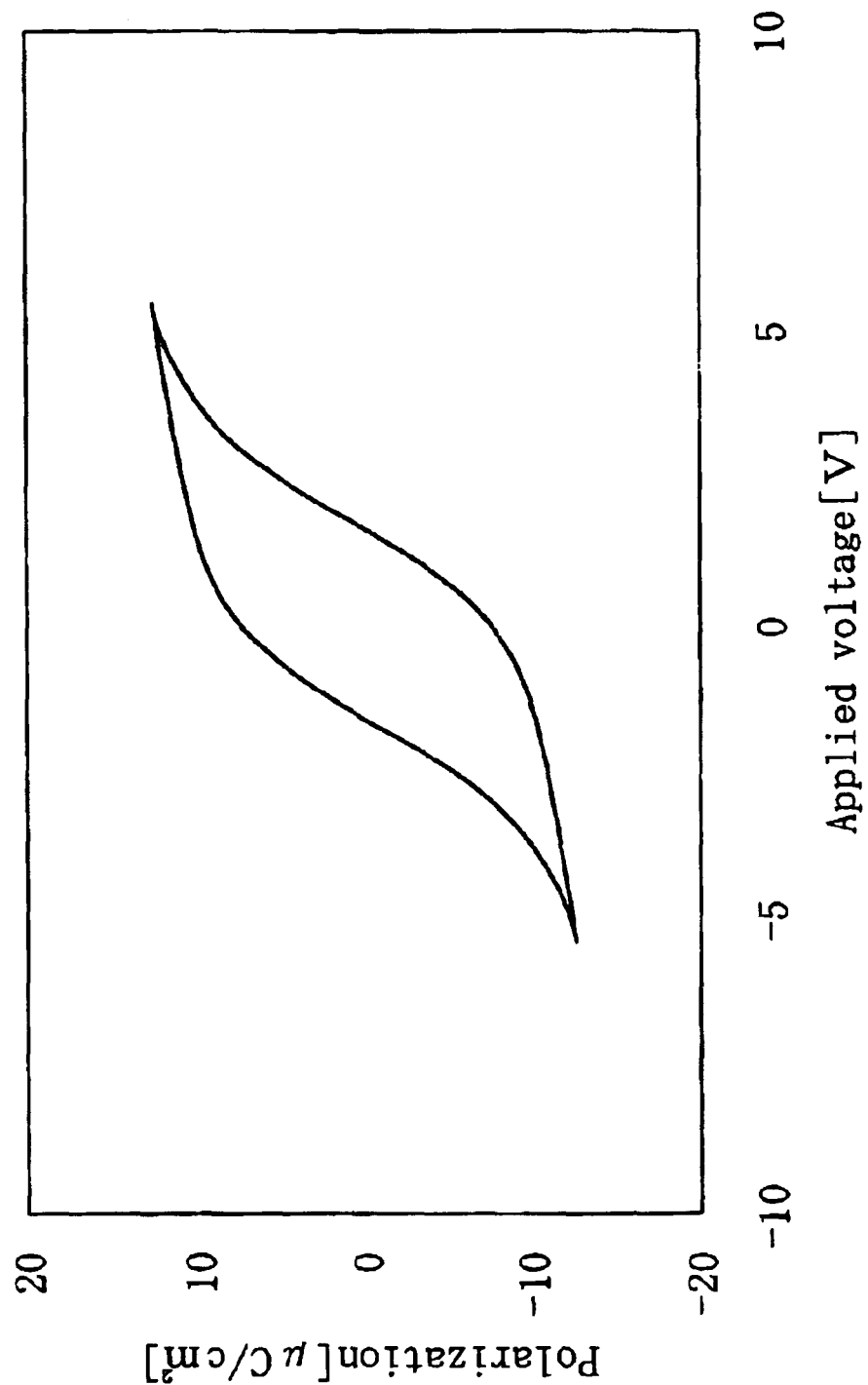
FIG. 2 is a graph showing characteristics of changes in polarization in a ferroelectric film according to voltages applied to both ends of a ferroelectric capacitor.
Figures 3, 4:
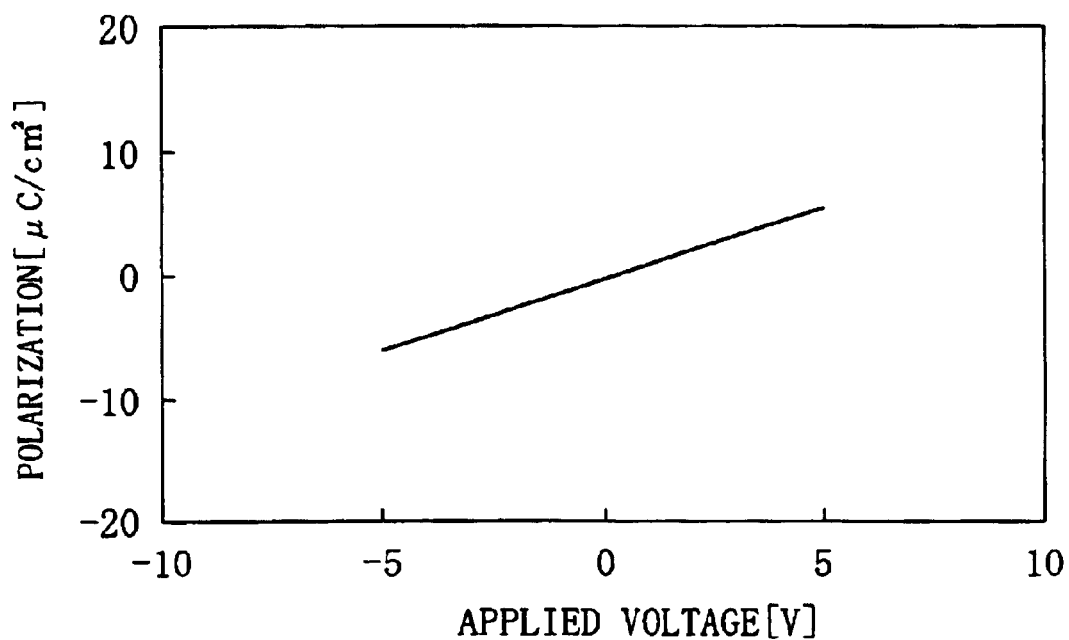
FIG. 3 is a graph showing characteristics of changes of polarization in a paraelectric film according to voltages applied to both ends of a paraelectric capacitor.
FIG. 4 is a table showing the input-output relation in accordance with the combinations of the logical values of selection signals D1 and D2.

FIG. 2 is a graph showing characteristics of changes in polarization in a ferroelectric film according to voltages applied to both ends of the ferroelectric capacitor. FIG. 3 is a graph showing characteristics of changes of polarization in a paraelectric film according to voltages applied to both ends of a paraelectric capacitor.

As shown in FIG. 2, the ferroelectric film in the ferroelectric capacitor 1 exhibits the quantity of polarization corresponding to the increase in the electric field applied to both ends of the ferroelectric film and also has the hysteresis characteristic that residual dielectric polarization remains even after the application of voltage has been stopped. It should be noted that even when using the same ferroelectric material, a larger-area ferroelectric film will have a larger quantity of polarization as a whole than smaller-area one. Accordingly, its residual dielectric polarization indicated by the hysteresis characteristic curve as shown in FIG. 2 apparently increases. Even in such a case, with the electric field represented by the abscissa, the same hysteresis characteristic as shown in FIG. 2 is obtained. Moreover, the residual dielectric polarization in the ferroelectric film has a characteristic that positive-negative inversion occurs when the residual dielectric polarization is higher than an electric field called a coercive electric filed. When the residual dielectric polarization is in a lower electric filed, a hysteresis curve called minor loop is drawn. On the other hand, as shown in FIG. 3, the paraelectric film in the paraelectric capacitor 2 changes linearly according to applied voltage, its residual dielectric polarization becomes 0 after the application of voltage has been stopped. This indicates that the paraelectric film does not have the hysteresis characteristic.

At this point, suppose that with the ferroelectric capacitor 1 as a high-capacitance-side capacitor connected in series with the paraelectric capacitor 2 as a low-capacitance-side capacitor, voltage is applied to both ends of the capacitors. The applied voltage is distributed among the ferroelectric and the paraelectric capacitors 1 and 2 and a gate oxide film of the FET 4 according to their effective capacitances. That is to say, the voltage is distributed among them so that the ferroelectric capacitor 1 and the paraelectric capacitor 2 store the same quantity of charges, meaning that a greater voltage is distributed to the capacitor having a smaller effective capacitance.

As a result, the potential at the intermediate node 9, i.e., the gate bias of the FET 4, is determined by the difference between the potentials of signals D1 and /D1 (or the difference between the potentials of signals D2 and /D2) applied to both ends of the serial capacitor 3, and the ratio among the voltages distributed to the ferroelectric capacitor 1, the paraelectric capacitor 2 and the gate oxide film.

In the circuit configuration in accordance with this embodiment, voltages applied to both ends of the serial capacitor 3 are, in general, a voltage of 0 V and the supply voltage VDD corresponding to the logical values "0" and "1", respectively. More specifically, a voltage corresponding to the supply voltage is applied to between both ends of the serial capacitor 3 for all the time in the forward direction or the backward direction. Moreover, the polarization of a ferroelectric material remains even after applied voltage has been removed. Thus, the voltage at the intermediate node 9 in each of two switching sections in one unit selector is maintained at a level resulting from distribution of an applied voltage in accordance with the effective capacitances of the ferroelectric capacitor 1 and the paraelectric capacitor 2 to the applied voltage.

For example, in the case where the ferroelectric capacitor 1 has a greater capacitance than the paraelectric capacitor 2, when the logical value of a selection signal D1 is 1, a high voltage is distributed to the paraelectric capacitor 2 in the serial capacitor 3 of the switching section 10A in the unit selector Use11. Accordingly, the potential of the intermediate node 9 becomes a first potential Vh that is higher than VDD/2. Meanwhile, in the serial capacitor 3 of the switching section 10B in the unit selector Use11, a high voltage is distributed to the paraelectric capacitor 2. Accordingly, the potential at the intermediate node 9 becomes a second potential Vl that is lower than VDD/2. When the logical value of the selection signal D1 is 0, on the other hand, the potential at the intermediate node 9 in the switching section 10A becomes the second potential Vl that is lower than VDD/2 and the potential at the intermediate node 9 in the switching section 10B becomes the first potential Vh that is higher than VDD/2.

Thus, in this embodiment, the design has been made so that the first potential Vh is higher than the threshold voltage of the FET 4 and the second potential Vl is lower than the threshold voltage of the FET 4. Then, when the logical value of a selection signal D1 is 1, the FET 4 of the switching section 10A turns ON and the FET 4 of the switching section 10B turns OFF. Accordingly, one input signal In1 is selected from the two input signals In1 and In2. When the logical value of the selection signal D1 is 0, on the other hand, the FET 4 of the switching section 10A turns OFF and the FET 4 of the switching section 10B turns ON. Accordingly, the other input signal In2 is selected from the two input signals In1 and In2.

In the same manner, in the unit selector Use12, when the logical value of a selection signal D1 is 1, the FET 4 of the switching section 10C turns ON and the FET 4 of the switching section 10D turns OFF. Accordingly, one input signal In3 is selected from the two input signals In3 and In4. When the logical value of the selection signal D1 is 0, on the other hand, the FET 4 of the switching section 10C turns OFF and the FET 4 of the switching section 10D turns ON. Accordingly, the other input signal In4 is selected from the two input signals In3 and In4.

In the same manner, in the unit selector Use21, when the logical value of a selection signal D2 is 1, the FET 4 of the switching section 20A turns ON and the FET 4 of the switching section 20B turns OFF. Accordingly, an output signal from the unit selector Use11 is selected. When the logical value of the selection signal D2 is 0, on the other hand, the FET 4 of the switching section 20A turns OFF and the FET 4 of the switching section 20B turns ON. Accordingly, an output signal from the unit selector Use12 is selected.

FIG. 4 is a table showing the input-output relation in accordance with the combinations of the logical values of selection signals D1 and D2. As shown in FIG. 4, according to the combinations of the logical values of the selections signals D1 and D2, a signal is uniquely selected from four input signals In1 through In4 and then output, meaning that a multiplex operation is achieved. Since the potentials at both ends of the serial capacitor 3 are nearly in a floating state, the potential of the intermediate node 9 is maintained even after the power supply has been cut. That is to say, with the residual dielectric polarization that has occurred in the respective ferroelectric capacitors 1 of the switching sections 10A through 10D and 20A and 20B, the multiplex operation is stored in a nonvolatile state.

Figure 5A:
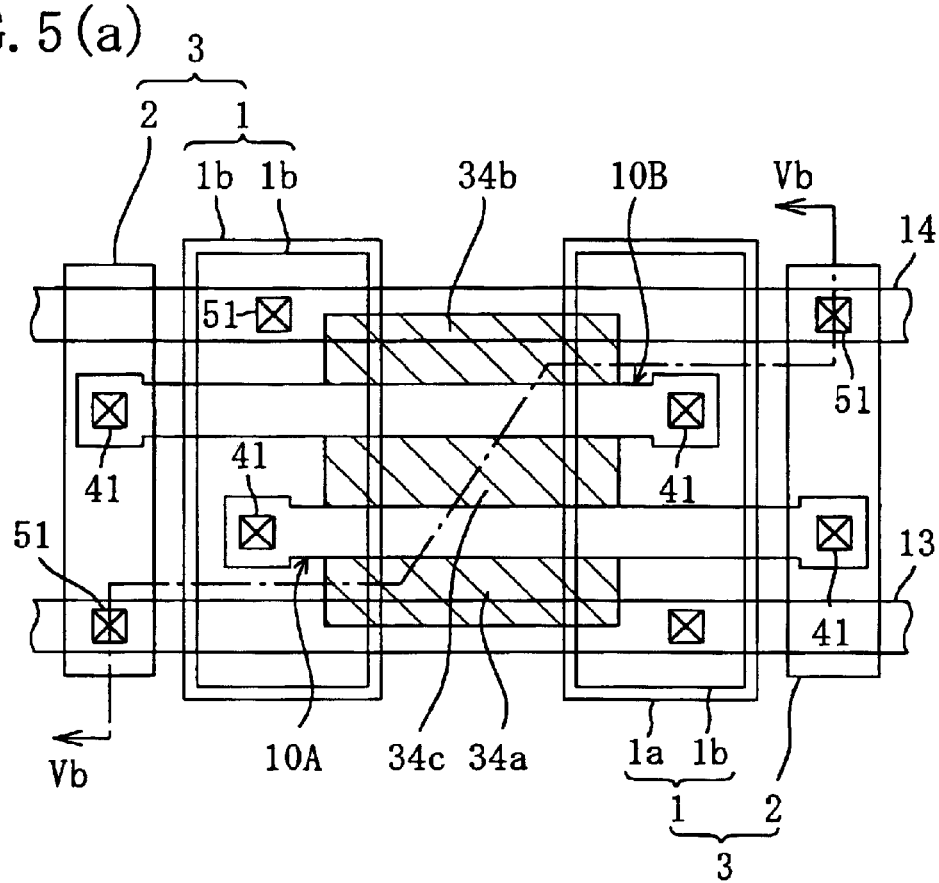
FIGS. 5(a) and 5(b) are a plane view illustrating an exemplary configuration of the unit selector according to the first embodiment and a cross-sectional view thereof taken along the line Va—Va, respectively.
Figure 5B:
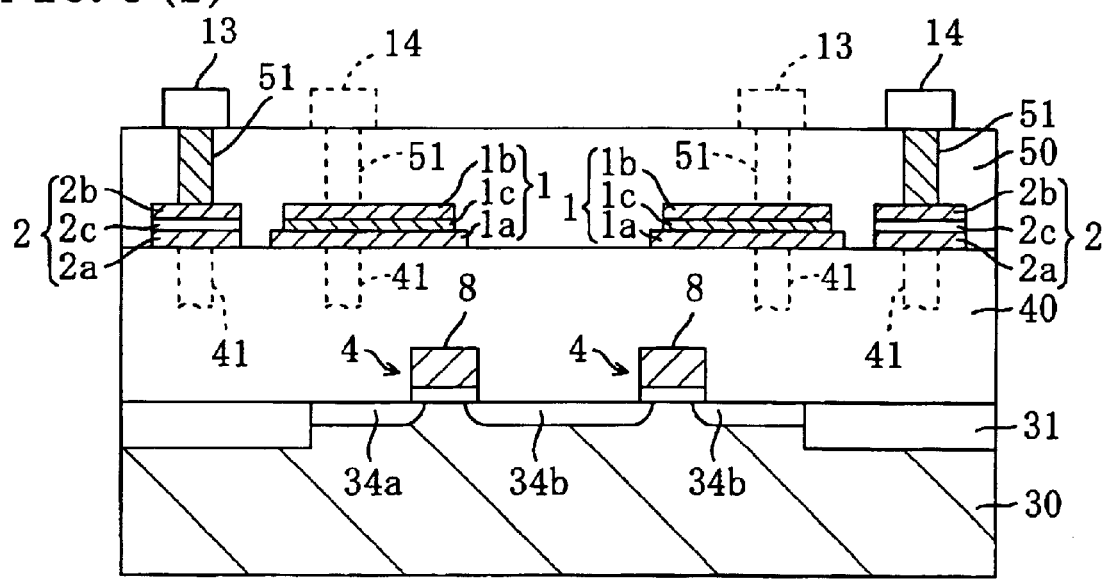

FIGS. 5(a) and 5(b) are a plane view illustrating an exemplary configuration of the unit selector and a cross-sectional view thereof taken along the line Va—Va, respectively. As shown in FIGS. 5(a) and 5(b), in an active region surrounded by an isolation 31 in a surface portion of a semiconductor substrate 30, three source/drain regions 34a, 34b and 34c containing an n-type impurity are provided. Over an area of the semiconductor substrate 30 located between the source/drain regions 34a and 34c and an area thereof located between the source/drain regions 34b and 34c, the gate electrodes 8 of the FETs 4 are provided with a gate oxide film interposed between the semiconductor substitute 30 and each gate electrode. Moreover, a first interlevel insulating film 40 is formed over the substrate so as to cover the FETs, and a serial capacitor 3 including a ferroelectric capacitor 1 and a paraelectric capacitor 2 is formed on the first interlevel insulating film 40. In one switching section 10A, the ferroelectric capacitor 1 includes a lower electrode 1a and an upper electrode 1b that are formed of Pt, and a paraelectric film 1c which is formed of PZP and interposed between the lower electrode 1a and the upper electrode 1b. The paraelectric capacitor 2 includes a lower electrode 2a and an upper electrode 2b that are formed of polysilicon, and a paraelectric film 2c which is formed of silicon oxide and interposed between the lower electrode 2a and the upper electrode 2b. The lower electrode 1a of the ferroelectric capacitor 1 and the lower electrode 2a of the paraelectric capacitor 1 are each connected to the corresponding gate electrode 8 through a W plug 41 passing through the first interlevel insulating film 110. The other switching section 10B has the same configuration as the above-described switching section 10A. Note that although the ferroelectric capacitors 1 and the paraelectric capacitors 2 are drawn so as to appear to be in the same cross-section for convenience sake in FIG. 5, each of the paraelectric capacitors 2 is juxtaposed with the corresponding ferroelectric capacitor 1 to extend in the width direction of the gate electrode 8 and the lower electrode 2a of each of the paraelectric capacitor 2 is connected to the corresponding gate electrode 8 via the W plug shown in FIG. 5.

Furthermore, on the first interlevel insulating film 40, a second interlevel insulating film 50 is provided so as to cover the capacitors 1 and 2, and signal lines 13 and 14 are provided on the second interlevel insulating film 50. The signal line 13 is connected to the upper electrode 1b of the ferroelectric capacitor 1 in the first switching section 10A and the upper electrode 2b of the paraelectric capacitor 2 in the second switching section 10B via respective W plugs 51 passing through the second interlevel insulating film 50. The signal line 14 is connected to the upper electrode 2b of the paraelectric capacitor 2 in the first switching section 10A and the upper electrode 1b of the ferroelectric capacitor 1 in the second switching section 10B via respective W plugs 51 passing through the second interlevel insulating film 50. Then, input signals are received in the source/drain regions 34a and 34b located at both ends of each of the FETs 4 and an output signal is output from the source/drain region 34c between the FETs 4.

Although the configuration of the unit selector Use11 has been described as an example in the foregoing description, the unit selectors Use12 and Use21 have basically the same configuration as that shown in FIG. 5.

Note that ferroelectric materials called Y1 and PZT that are generally used in ferroelectric memories can be used as the ferroelectric film 1c of the ferroelectric capacitor 1. Moreover, although use of a silicon oxide film as the paraelectric film 2c of the paraelectric capacitor 2 makes fabrication processes technically simple, materials used are not specifically limited.

Also, although the ferroelectric capacitor 1 has a larger capacitance than the paraelectric capacitor 2 in this embodiment, this relationship between the two capacitances may be reversed.

—Second Embodiment—

Figure 6:
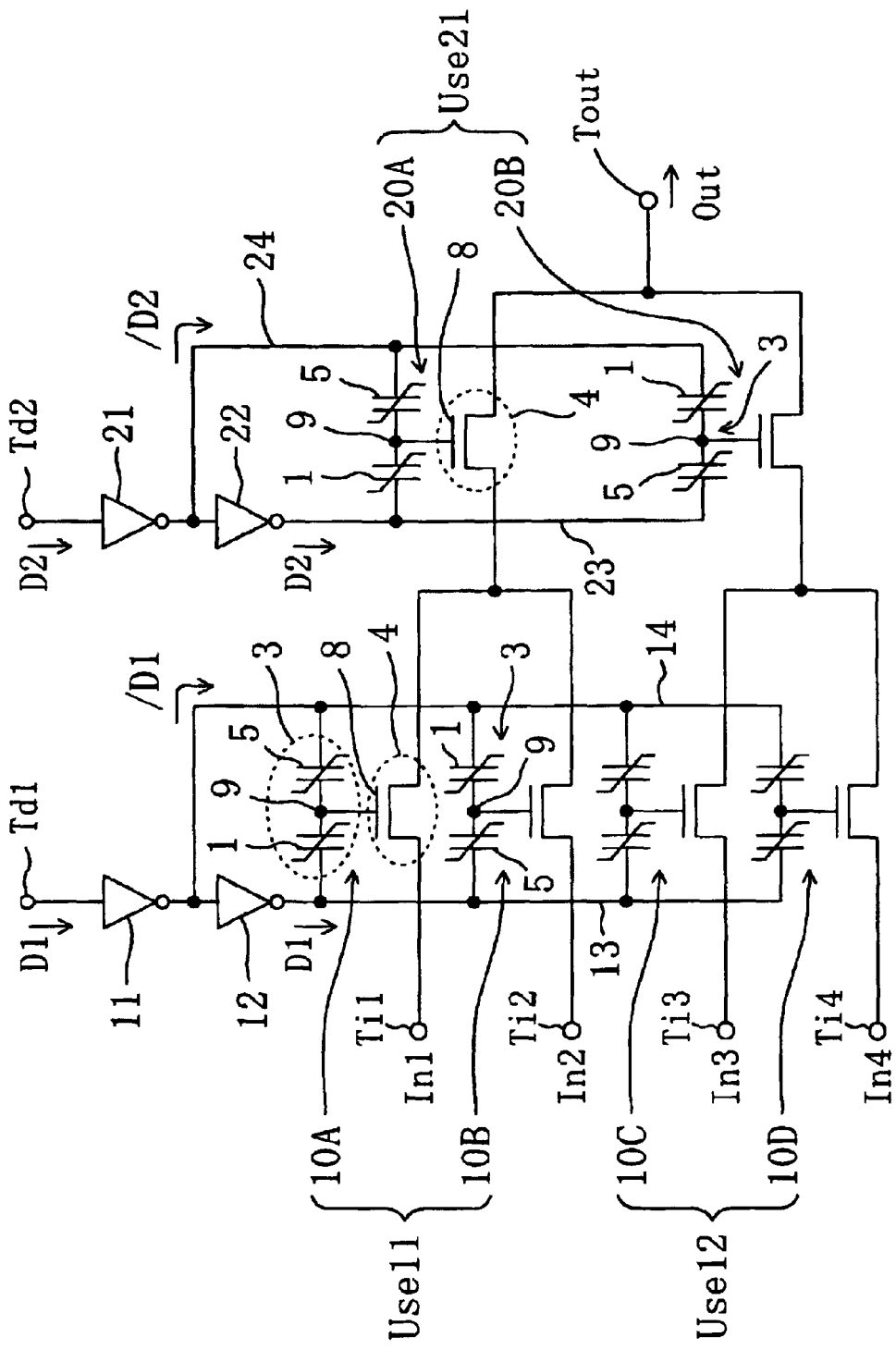
FIG. 6 is a circuit diagram of a multiplexer according to a second embodiment.

FIG. 6 is a circuit diagram of a multiplexer in accordance with a second embodiment. According to the second embodiment, the multiplexer includes a low-capacitance-side ferroelectric capacitor 5 instead of the paraelectric capacitor 2 of the first embodiment. More specifically, a serial capacitor 3 includes a ferroelectric capacitor 1 and a low-capacitance-side ferroelectric capacitor 5.

This embodiment is characterized in that each of a high-capacitance-side capacitor and a low-capacitance-side capacitor is constituted by a ferroelectric capacitor having a ferroelectric film. In this embodiment, the hysteresis curve for the low-capacitance-side ferroelectric capacitor 5 has a different shape from that of the ferroelectric capacitor 1, indicating that the residual dielectric polarization is smaller than that of the ferroelectric capacitor 1.

In this embodiment, the configuration of a unit capacitor differs from that of the first embodiment shown in FIG. 5 only in that a low-capacitance-side ferroelectric capacitor 5 is provided instead of the paraelectric capacitor 2 and hence illustration of the configuration will be omitted. Note that it is assumed that the lower electrode, the ferroelectric film and the upper electrode of the low-capacitance-side ferroelectric capacitor 5 are formed of the same materials of the lower electrode 1a, the ferroelectric film 1c and the upper electrode 1b of the ferroelectric capacitor 1, respectively, and that the area of the low-capacitance-side ferroelectric capacitor 5 is smaller than that of the ferroelectric capacitor 1.

Also in this embodiment, in a unit selector, the potential at an intermediate node 9 is determined according to the logical values of a selection signal D1 basically in the same manner as in the first embodiment. More specifically, with the ferroelectric capacitor 1 as a high-capacitance-side capacitor and the ferroelectric capacitor 5 as a low-capacitance-side capacitor connected to each other in series, when a voltage is applied to both ends, the applied voltage is distributed according to the effective capacitances of the ferroelectric capacitor 1, the low-capacitance-side ferroelectric capacitor 5 and a gate oxide film of the FET 4. That is to say, the voltage is distributed so that the ferroelectric capacitor 1 and the low-capacitance-side ferroelectric capacitor 5 store the same quantity of charges, meaning that a greater voltage is distributed to the capacitor having a smaller effective capacitance. By utilizing this, the same multiplex operation as in the first embodiment can be carried out.

Also in this embodiment, the input-output relation in accordance with the combinations of the logical values of selection signals D1 and D2 as shown in FIG. 4 can be obtained.

Specifically, since this embodiment utilizes the nonvolatile memory functions of two ferroelectric capacitors in a switching section, it can be advantageously reinforced in nonvolatile memory function to a further extent, compared to the first embodiment. Moreover, the lower electrodes, ferroelectric films and upper electrodes of the capacitors 1 and 5 can be formed in common process steps, and thus fabrication process steps can be simplified.

As means for making the effective capacitance values different between the two ferroelectric capacitors 1 and 5, there exist three potential means, one means for using two ferroelectric materials having different dielectric constants, the second for using the same ferroelectric material for the two capacitors but making their sizes of area different, and the third for using the same ferroelectric material but making the thicknesses of the ferroelectric films of the capacitors 1, 5 different. It is simple and convenient, however, either to make the areas different while using the same ferroelectric material or to make the thicknesses of ferroelectric films different while using the same ferroelectric material makes fabrication process simple.

If the effective capacitances of the capacitors are varied by forming two capacitors with different sizes of area as in this embodiment, modification can be made by designing. Accordingly, in addition to the above-described effects of reducing the number of process steps, another advantage can be attained that property change becomes possible at a designing stage.

In addition, even in the case where ferroelectric films are formed to have different thicknesses, the number of materials used can be reduced, compared to the case where ferroelectric materials having different dielectric constants are used, because the same ferroelectric material can be used. Furthermore, when one ferroelectric films is formed to have a small thickness, an increase in the area occupied can be suppressed.

—Third Embodiment—

Figure 7:
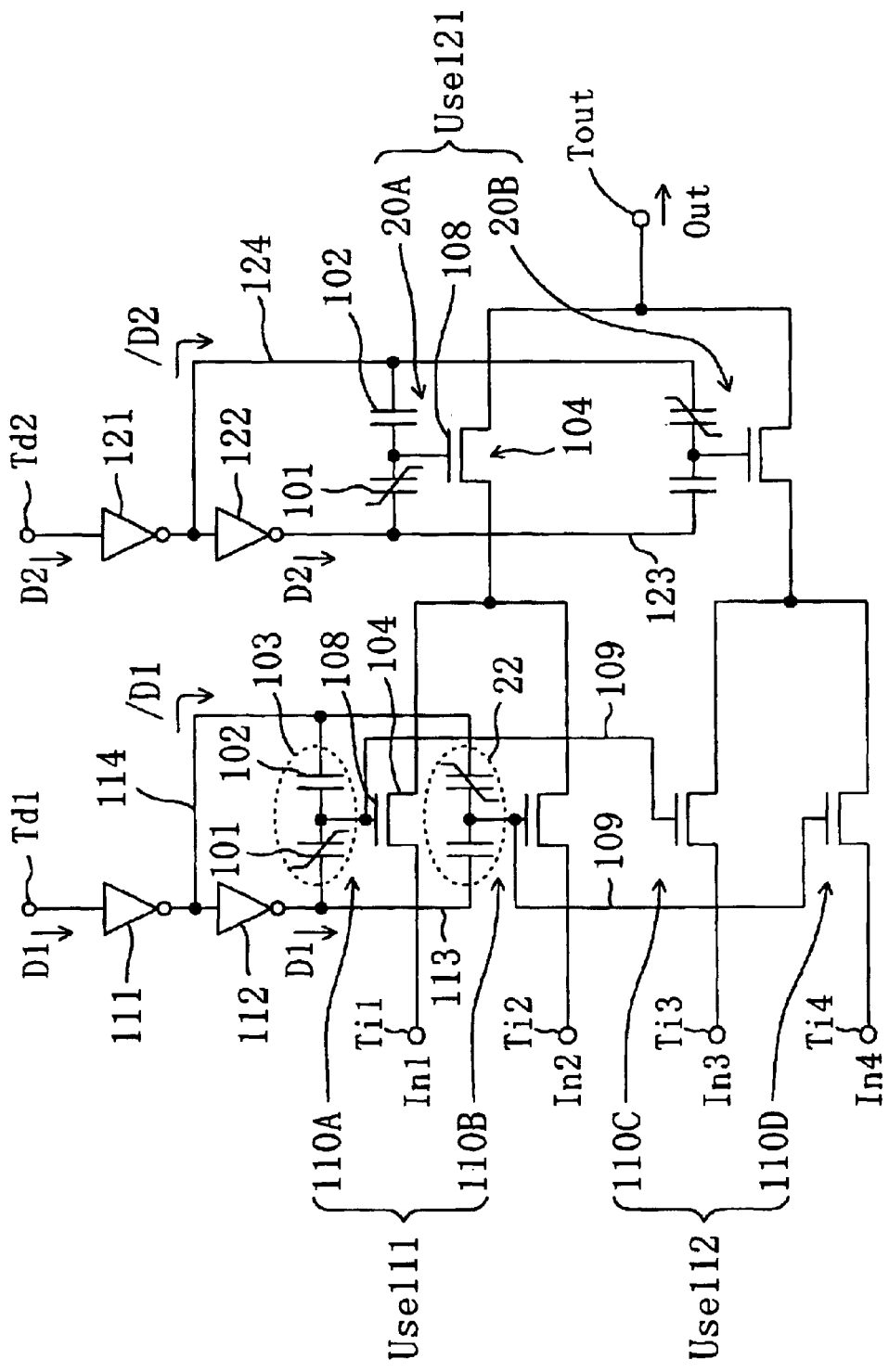
FIG. 7 is a circuit diagram of a nonvolatile multiplexer that is a nonvolatile selector according to a third embodiment.

FIG. 7 is a circuit diagram of a nonvolatile multiplexer that is a nonvolatile selector according to a third embodiment.

As shown in FIG. 7, the multiplexer of this embodiment is configured so as to receive four input signals In1 through In4 from four respective input terminals Ti1 through Ti4 and to output from an output terminal Tout, as an output signal Tout, one signal selected from the four input signals In1 through In4 in accordance with selection signals D1 and D2 received from two control terminals Td1 and Td2. Then, a pre-stage gate for selecting two input signals from the four input signals includes first through fourth switching sections 110A through 110D for switching their states to pass or block input signals. Each of the switching sections 110 includes a serial capacitor 103 and a FET 104. The serial capacitor 103 includes a ferroelectric capacitor 101, i.e., a high-capacitance-side capacitor, and a paraelectric capacitor 102, i.e., a low-capacitance-side capacitor, which are connected to each other in series via an intermediate node 109.

In this embodiment, each of gate electrodes 108 of the first and third switching sections 110A and 110C is connected to their common serial capacitor 103 via their common intermediate node 109, and each of gate electrodes 108 of the second and fourth switching sections 110B and 110D is connected to their common serial capacitor 103 via their common intermediate node 109. That is to say, the first and third switching sections 110A and 110C share a serial capacitor 103 and the second and fourth switching sections 110B and 110D share a serial capacitor 103.

The pre-stage gate includes a first inverter 111 that receives a selection signal D1 and then generates an inverted selection signal /D1, and a second inverter 112 that receives an inverted selection signal /D1 from the first inverter 111 and then generates a selection signal D1. The inverted selection signal /D1 output from the first inverter 111 is transmitted to the respective serial capacitors 103 of the first and second switching sections 110A and 110B via a signal line 113, and the selection signal D1 output from the second inverter 112 is transmitted to the respective serial capacitors 103 of the first and second switching sections 110A and 110B via a signal line 114. That is to say, the selection signal D1 and the inverted selection signal /D1 are applied to both ends of each of the serial capacitors 103.

In the pre-stage gate, the first and second switching sections 110A and 110B make up a unit selector Use111 and the third and fourth switching sections 110C and 110D make up a unit selector Use112. In the switching section 110A which is one of the two switching sections of the unit selector Use111, the selection signal D1 is applied to the ferroelectric capacitor 101 and the inverted selection signal /D1 is applied to the paraelectric capacitor 102. In the switching section 110B which is the other switching section of the unit selector Use111, on the other hand, the selection signal D1 is applied to the paraelectric capacitor 102 and the inverted selection signal /D1 is applied to the ferroelectric capacitor 101. In the same manner, in the switching section 110C which is one of the two switching sections of the unit selector Use112, the selection signal D1 is applied to the ferroelectric capacitor 101 and the inverted selection signal /D1 is applied to the paraelectric capacitor 102. In the switching section 110D which is the other switching section of the unit selector Use112, on the other hand, the selection signal D1 is applied to the paraelectric capacitor 102 and the inverted selection signal /D1 is applied to the ferroelectric capacitor 101. In other words, in either unit selector Use111 or Use112, a voltage applied to one switching section's ferroelectric capacitor has the opposite polarity to that of a voltage applied to the other switching section's ferroelectric capacitor.

Moreover, a subsequent-stage gate includes a first inverter 121 that receives a selection signal D2 and then generates an inverted selection signal /D2, and a second inverter 122 that receives an inverted selection signal /D2 from the first inverter 121 and then generates a selection signal D2. The inverted selection signal /D2 output from the first inverter 121 is transmitted to the respective serial capacitors 103 of all of the switching sections 120A and 120B via a signal line 123. The selection signal D2 output from the second inverter 122 is transmitted to the respective serial capacitors 103 of all of the switching sections 120A and 120B via a signal line 124. That is to say, the selection signal D2 and the inverted selection signal /D2 are applied to both ends of each of the serial capacitors 103. In the subsequent-stage gate, the two switching sections 120A and 120B make up a unit selector Use121. In the switching section 120A which is one of the two switching sections of the unit selector Use121, the selection signal D2 is applied to the ferroelectric capacitor 101 and the inverted selection signal /D2 is applied to the paraelectric capacitor 102. In the switching section 120B which is the other switching section of the unit selector Use121, on the other hand, the selection signal D2 is applied to the paraelectric capacitor 102 and the inverted selection signal /D2 is applied to the ferroelectric capacitor 101. In other words, also in the unit selector of the subsequent-stage gate, a voltage applied to one switching section's ferroelectric capacitor has the opposite polarity to that of a voltage applied to the other switching section's ferroelectric capacitor.

As has been described, the nonvolatile multiplexer of this embodiment has the configuration in which the unit selectors Use111 and Use112 are disposed in the pre-stage gate and the unit selector Use121 is disposed in the subsequent-stage gate. That is to say, the nonvolatile multiplexer of this embodiment has substantially the same configuration as that of the first embodiment.

A characteristic of this embodiment is that in the pre-stage gate, the two switching sections 110A and 110C share a serial capacitor 103 and the two switching sections 110B and 110D share a serial capacitor 103.

Figure 8:
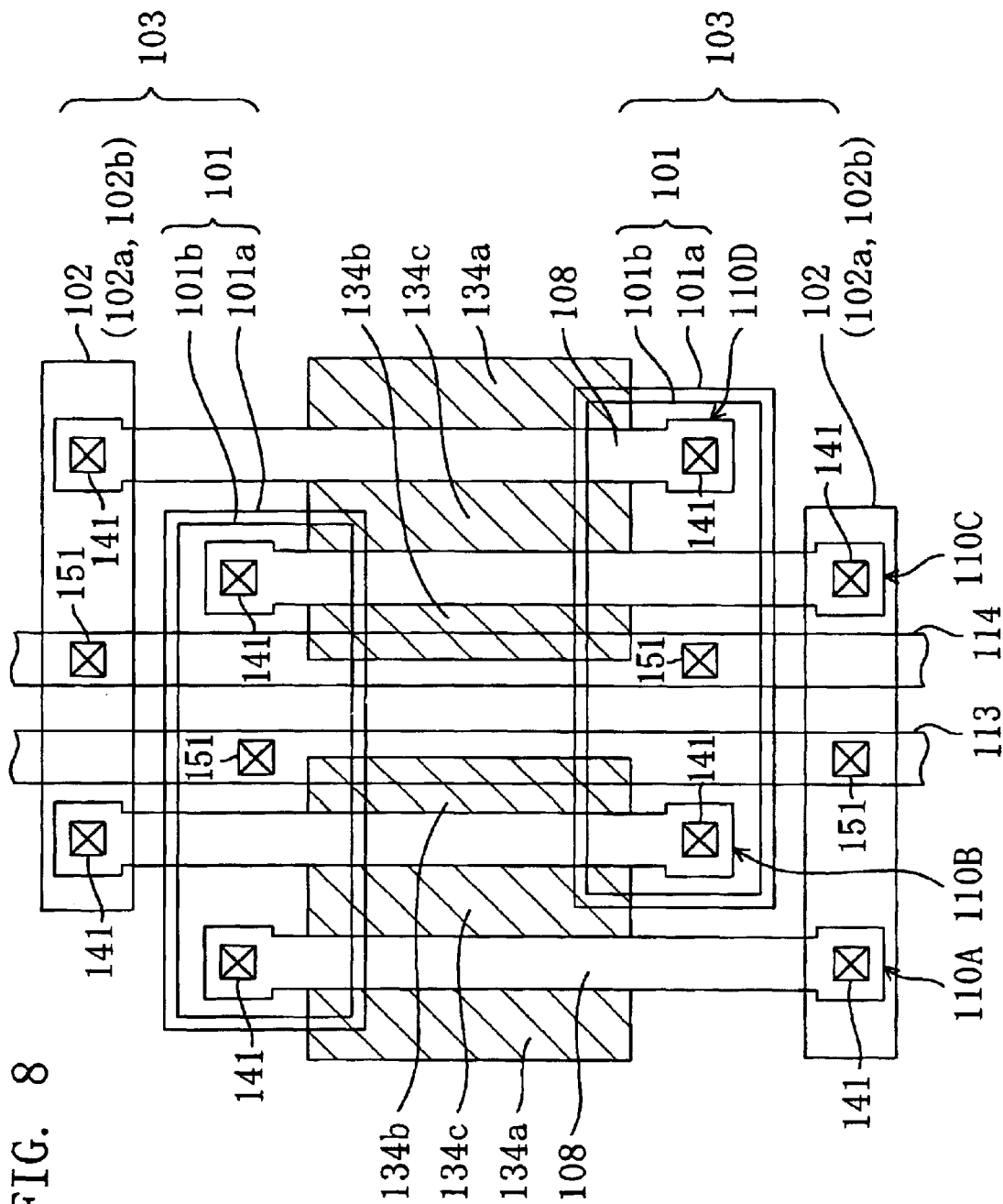
FIG. 8 is a plane view illustrating an exemplary configuration of a pre-stage gate according to the third embodiment.

FIG. 8 is a plane view illustrating an exemplary configuration of the pre-stage gate. As shown in FIG. 8, in each of two active regions that is surrounded by an isolation in a surface portion of a semiconductor substrate, three source/drain regions 134a, 134b and 134c containing an n-type impurity are formed. Over an area of the semiconductor substrate located between the source/drain regions 134a and 134c and an area thereof between the source/drain regions 134b and 134c, the gate electrodes 108 of the FETs 104 are provided with a gate oxide film interposed between the semiconductor substrate and each gate electrode. Moreover, a first interlevel insulating film formed over the substrate to cover the FETs, and the two serial capacitors 103 each of which includes a ferroelectric capacitor 101 and a paraelectric capacitor 102 are formed on the first interlevel insulating film. The lower electrode 101a of the ferroelectric capacitor 101 of one of the two serial capacitors is connected to each of the respective gate electrodes 108 of the first and third switching sections 110A and 110C via respective W plugs 141. The lower electrode 101a of the ferroelectric capacitor 101 of the other serial capacitors is connected to the respective gate electrodes 108 of second and fourth switching sections 110B and 110D via respective W plugs 141. The cross-sectional structures of the ferroelectric capacitor 101 and the paraelectric capacitor 102 are the same as those of the first embodiment shown in FIG. 5.

Furthermore, on the first interlevel insulating film, a second interlevel insulating film is formed so as to cover the capacitors 101 and 102, and signal lines 113 and 114 are formed on the second interlevel insulating film. The signal line 113 is connected to the upper electrode 101b of the ferroelectric capacitor 101 in one of the two serial capacitors 103 and the upper electrode 102b of the paraelectric capacitor 102 in the other serial capacitor 103 via respective W plugs 151 passing through the second interlevel insulating film. The signal line 114 is connected to the upper electrode 102b of the paraelectric capacitor 102 of said other serial capacitor 103 and the upper electrode 101b of the ferroelectric capacitor 101 of said one serial capacitor 103 via respective W plugs 151 passing through the second interlevel insulating film. Input signals are received in the source/drain regions 134a and 134b located at the ends of each FET 104 and then an output signal is output from the source/drain region 134c located between the adjacent FETs 104.

In this embodiment, the advantage can be achieved that the number of the serial capacitors at the pre-stage gate can be half, compared to the first embodiment, resulting in reduction in area of an integrated circuit constituting a multiplexer.

—Fourth Embodiment—

Figure 9:
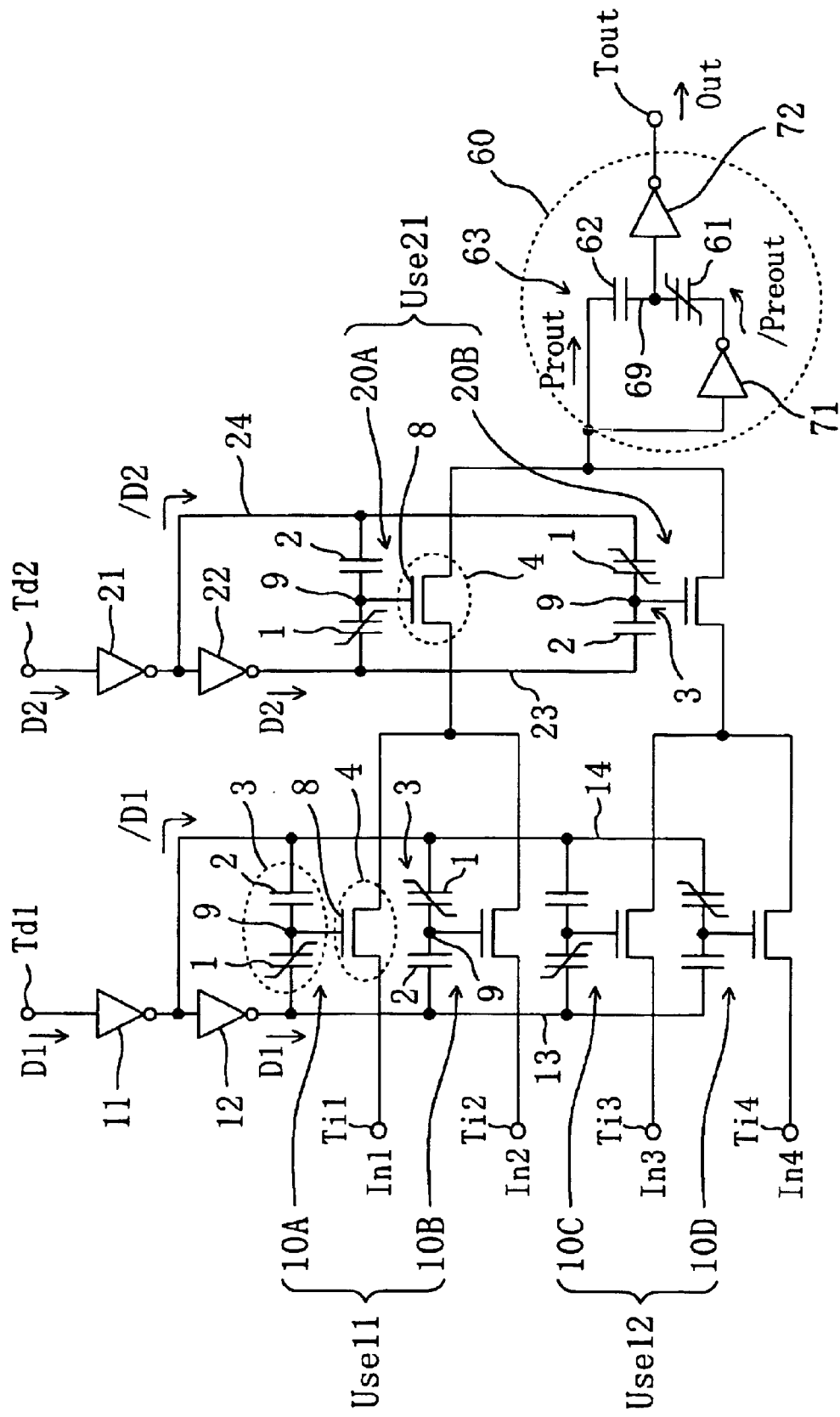
FIG. 9 is a circuit diagram of a multiplexer according to a fourth embodiment.

FIG. 9 is a circuit diagram of a multiplexer according to a fourth embodiment. The multiplexer of this embodiment includes, in addition to the members of the multiplexer of the first embodiment, an output signal retaining section 60 for storing the output state of an output terminal Tout in a nonvolatile state. The output signal retaining section 60 includes a serial capacitor 63 in which a ferroelectric capacitor 61 and a paraelectric capacitor 62 are connected to each other via an intermediate node 69. Moreover, the output signal retaining section 60 is provided with an inverter 71 for generating an inversion signal /Prout obtained by inverting a signal Prout output from a subsequent-stage gate of the multiplexer, and an inverter 72 located between the intermediate node 69 and the output terminal Tout.

With this configuration, a signal Prout output from the multiplexer and its inversion signal /Prout are applied to both ends of the serial capacitor 63. Thus, in the same manner as in the case of the potential at the intermediate node 9 in each of switching sections 10, the potential at the intermediate node 69 of the output signal retaining section 60 can be held, according to the difference between the capacitance values of the ferroelectric capacitor 61 and the paraelectric capacitor 62, at a low potential if the logical value of the signal Prout is 1, or at a high potential if the logical value of the signal Prout is 0. Then, the potential at the intermediate node 69 is inverted by the inverter 72 and then the inverted signal is output as an output signal Out from the output terminal Tout.

Accordingly, with the multiplexer of this embodiment, the same operation as that of the multiplexer of the first embodiment can be carried out while the logical value of an output signal can be retained in a nonvolatile state. Therefore, even after power supply has been cut, for example, at the next power-on, operation can be started in the same state as at the time when the power supply has been cut.

Note that an input signal retaining section having the same configuration as the output signal retaining section may be provided at a stage subsequent to the input terminals Ti1 through Ti4. In such a case, the logical values of the input signals In1 through In4 can be stored in a nonvolatile state. In that case, as will be described later, when the multiplexer of this embodiment is operated as a demultiplexer, an output state can be stored in a nonvolatile state. Accordingly, there can be obtained the advantage that after power supply has been cut, a demultiplex operation can be carried out at the next power-on in the same state as at the time when the power supply has been cut or like advantages.

—Fifth Embodiment—

Figure 10:
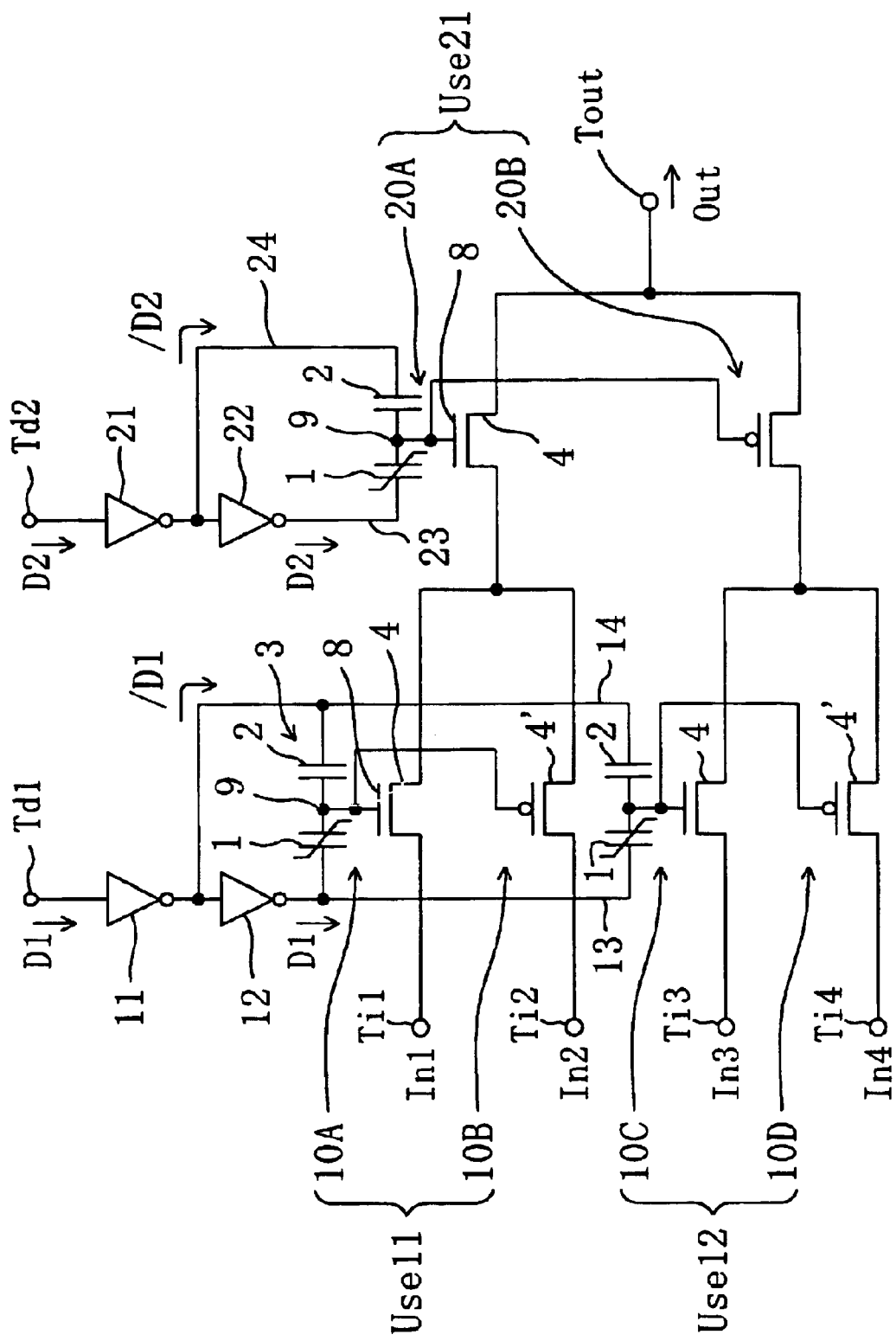
FIG. 10 a circuit diagram of a nonvolatile multiplexer that is a nonvolatile selector according to a fifth embodiment.

FIG. 10 is a circuit diagram of a nonvolatile multiplexer that is a nonvolatile selector according to a fifth embodiment.

As shown in FIG. 10, the multiplexer of this embodiment has a configuration in which the serial capacitors are removed from the second and fourth switching sections 10A and 10D of the pre-stage gate in the first embodiment and a p-channel FET 4' is disposed instead of the n-channel FET 4. The gate electrodes 8 of the p-channel FETs 4' of the second and fourth switching sections 10B and 10D are connected to the intermediate nodes 9 of the first and third switching sections 10A and 10C, respectively. The multiplexer of this embodiment has also a configuration in which from the second switching section 20B of the subsequent-stage gate in the first embodiment, the serial capacitor is removed and a p-channel FET 4' is disposed instead of the n-channel FET 4. The gate electrode 8 of the p-channel type FET 4' of the second switching section 20A is connected to the intermediate node 9 of the first switching section 20A. The configurations of other elements are as shown in FIG. 1.

According to the multiplexer of this embodiment, in both of the first and second switching sections 10A and 10B of the unit selector Use11 in the pre-stage gate, a selection signal D1 is applied to the ferroelectric capacitor 1 and an inverted selection signal /D1 is applied to the paraelectric capacitor 2. In the same manner, in both of third and fourth switching sections 10C and 10D of the unit selector Use12, a selection signal D1 is applied to the ferroelectric capacitor 1 and an inverted selection signal /D1 is applied to the paraelectric capacitor 1. In other words, in either unit selectors Use11 or Use12, a voltage applied to the ferroelectric capacitor of one of the two switching sections and a voltage applied to the ferroelectric capacitor of the other switching section have the same polarity.

Moreover, in both of the first and second switching sections 20A and 20B in the subsequent-stage gate, a selection signal D2 is applied to the ferroelectric capacitor 1 and an inverted selection signal /D2 is applied to the paraelectric capacitor 2. In other words, also in the subsequent-stage gate, a voltage applied to the ferroelectric capacitor of one of the two switching sections and a voltage applied to the ferroelectric capacitor of the other switching section have the same polarity.

Accordingly, with the ferroelectric capacitor 1 having a larger capacitance than the paraelectric capacitor 2, if both of the logical values of selection signals D1 and D2 are 1, the potential at each of the intermediate nodes 9 becomes the first potential Vh that is higher than VDD/2. On the other hand, if both of the logical values of the selections signals D1 and D2 are 0, the potential of each at the intermediate nodes 9 becomes the second potential V1 that is lower than VDD/2.

Thus, in this embodiment, the multiplexer is designed so that the first potential Vh is higher than the threshold voltage of the n-channel FET 4 and the threshold voltage of the p-channel FET 4. Then, when the logical value of a selection signal D1 is 1, the FET 4 of the switching section 10A turns ON whereas the FET 4 of the switching section 10B turns OFF. Thus, one of the two input signals In1 and In2, i.e., the input signal In1, is selected. When the logical value of the selection signal D1 is 0, on the other hand, the FET 4 of the switching section 10A turns OFF whereas the FET 4 of the switching section 10B turns ON. Thus, the other of the two input signals In1 and In2, i.e., the input signal In2, is selected. The same operation is carried out in the other unit selectors Use12 and Use21.

With this embodiment, the same muliplepelx operation as that of the first embodiment can be achieved and the number of serial capacitors can be reduced to half that of the first embodiment in both of the pre-stage gate and the subsequent-stage gate, thus resulting in the advantage of reduction in the area of an integrated circuit device constituting a multiplexer.

Note that also in the second and fourth embodiments, a p-channel FET may be disposed instead of an n-channel FET 4 in each of the switching sections 10B, 10D and 20B, and a serial capacitor 3 may be removed.

—Sixth Embodiment—

Figure 11:
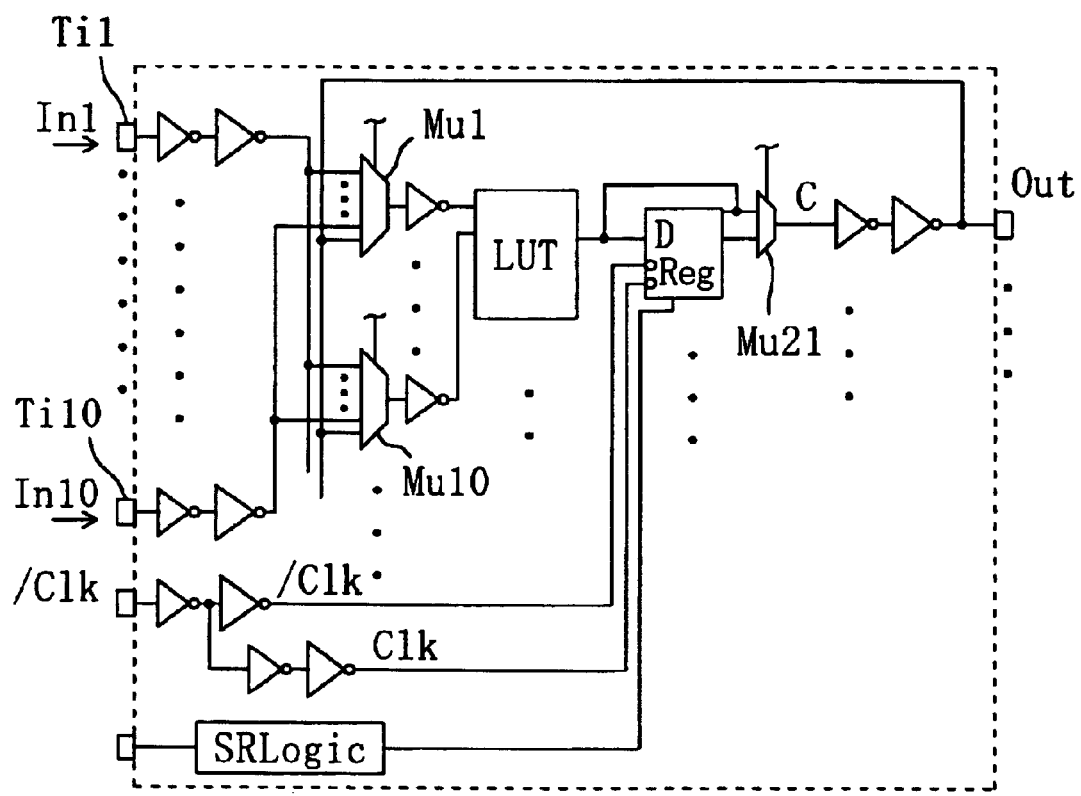
FIG. 11 is a circuit diagram of an FPGA according a sixth embodiment.

FIG. 11 is a circuit diagram of an FPGA (field programmable gate-array) according a sixth embodiment. In this embodiment, multiplexers Mu1 through Mu10 and Mu21 each of which has one of the configurations of the first through fifth embodiments, an LUT (look up table), a register (reg), an SR logic (set/reset logic) and the like are disposed.

In this embodiment, since multiplexers including the nonvolatile selector (the unit selector) of this invention are disposed in the FPGA on which a program can be written, multiplex operation can be stored according to the program written in a nonvolatile state, even though no SRAM is provided. Thus, reduction in the area occupied by a circuit, simplification of control or like advantages can be achieved.

—Seventh Embodiment—

Figure 12:
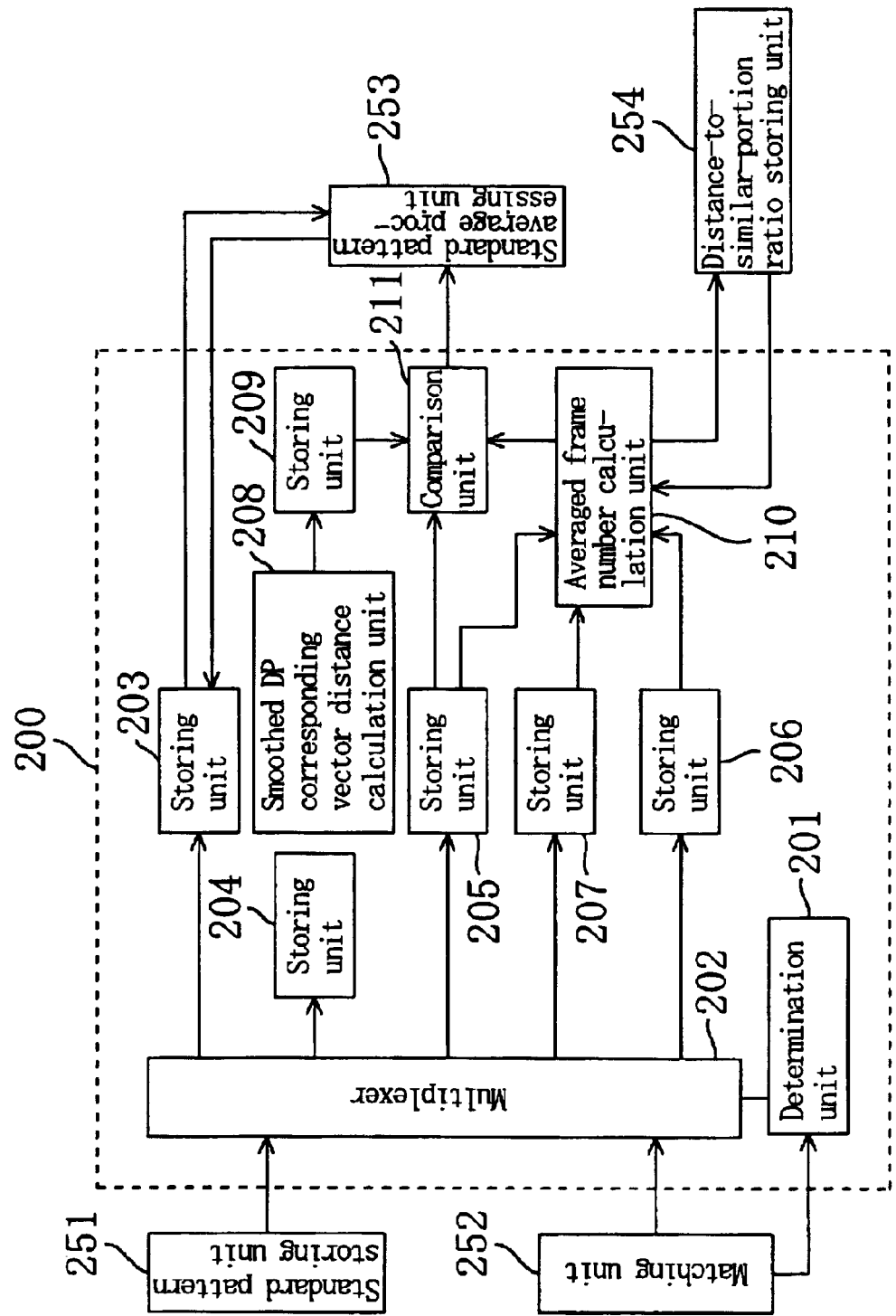
FIG. 12 is a circuit diagram illustrating part of the configuration of a recognition system according to a seventh embodiment.

FIG. 12 is a circuit diagram illustrating part of the configuration of a recognition system according to a seventh embodiment. As shown in FIG. 12, the recognition system includes a standard pattern storing unit 251 for storing a standard pattern, a matching unit 252 for calculating the distance between two patterns using a known dynamic programming, a similar portion detecting unit 200, a standard pattern average processing unit 253, and a distance-to-similar-portion ratio storing unit 254.

In the similar portion detecting unit 200, disposed are a determination unit 201 for determining whether a value for the DP distance is the Kth smallest or smaller, and a multiplexer 202 for transmitting, according to instructions of the determination unit 201, distortion functions, i.e., calculation results by the matching unit 252, a DP corresponding vector distance for an I frame, and the category name and the DP distance of a standard pattern to storing units 203, 204, 205 and 206 respectively, receiving the number of frames of the pattern under the category name from the standard pattern storing unit 251 and then transmitting the number to a storing unit 207.

In the similar portion detecting unit 200, further disposed are a smoothed DP corresponding vector distance calculation unit 208, a storing unit 209 for storing a distance obtained by shifting a smoothed DP corresponding vector distance frame by frame, an averaged frame number calculation unit 210, a comparison unit 211 and the like. The operations of those elements are not directly relevant to the present invention, and hence description thereof will be omitted.

The recognition system is provided for precisely detecting pairs of similar standard patterns and their similar portions and then averaging only the similar portions to obtain a high recognition rate.

If a nonvolatile multiplexer having one of the configurations of the first through the fifth embodiments is provided as the multiplexer 202 in the similar portion detecting unit 200, data stored in the determination unit 201 need not be latched. That is to say, determination results obtained in the previous operation can be retained in the multiplexer 202 in a nonvolatile state, thus resulting in reduction in the area occupied by a circuit, simplification of control and the like.

The recognition system shown in FIG. 12 is an example of recognition systems to which the present invention can be applied, and a multiplexer with nonvolatile selectors of the present invention may be disposed in recognition systems other than one shown in FIG. 12.

—Eighth Embodiment—

Figure 13:
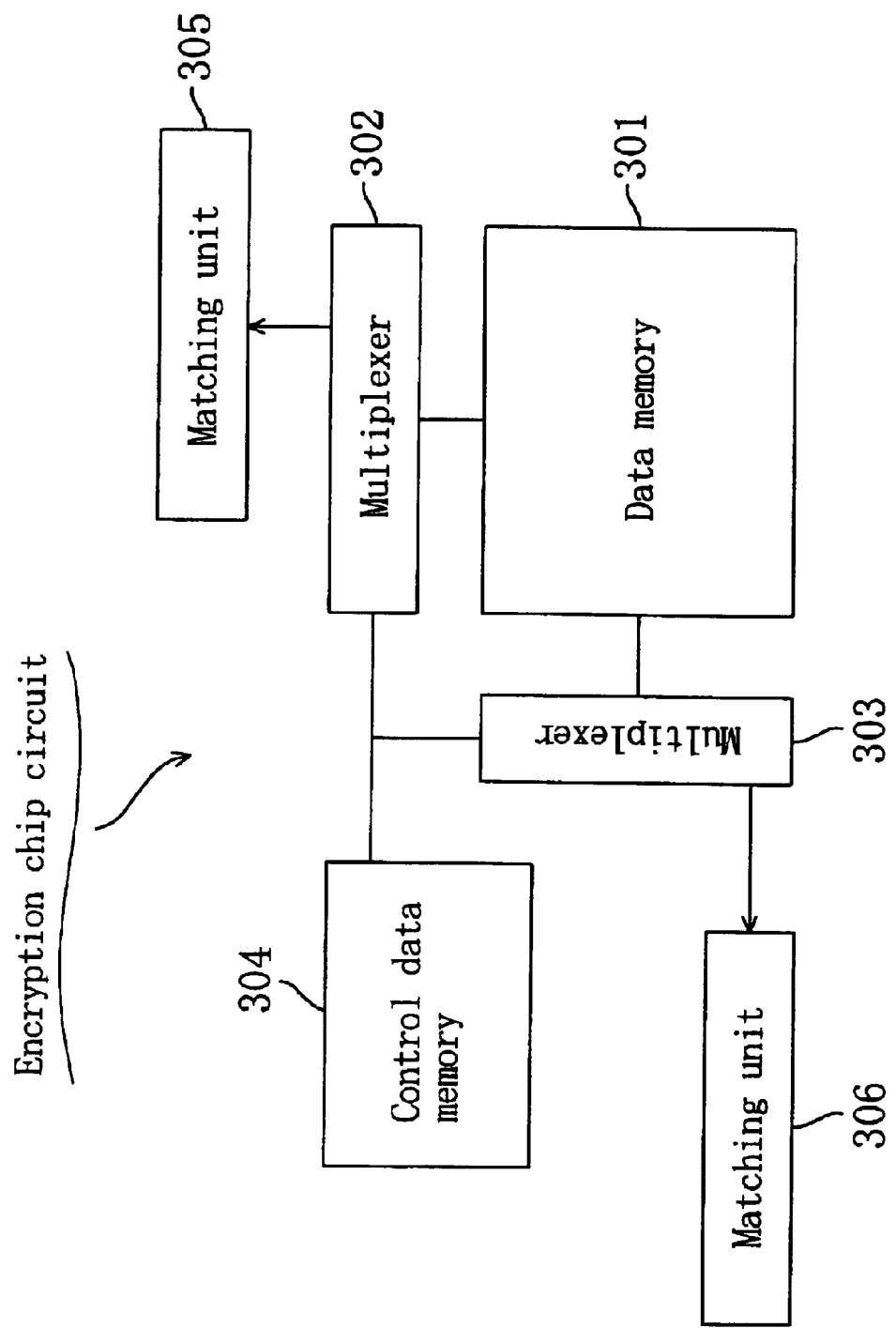
FIG. 13 is a block circuit diagram schematically illustrating the configuration of an encryption chip circuit according to an eighth embodiment.
Figures 14A, 14B:
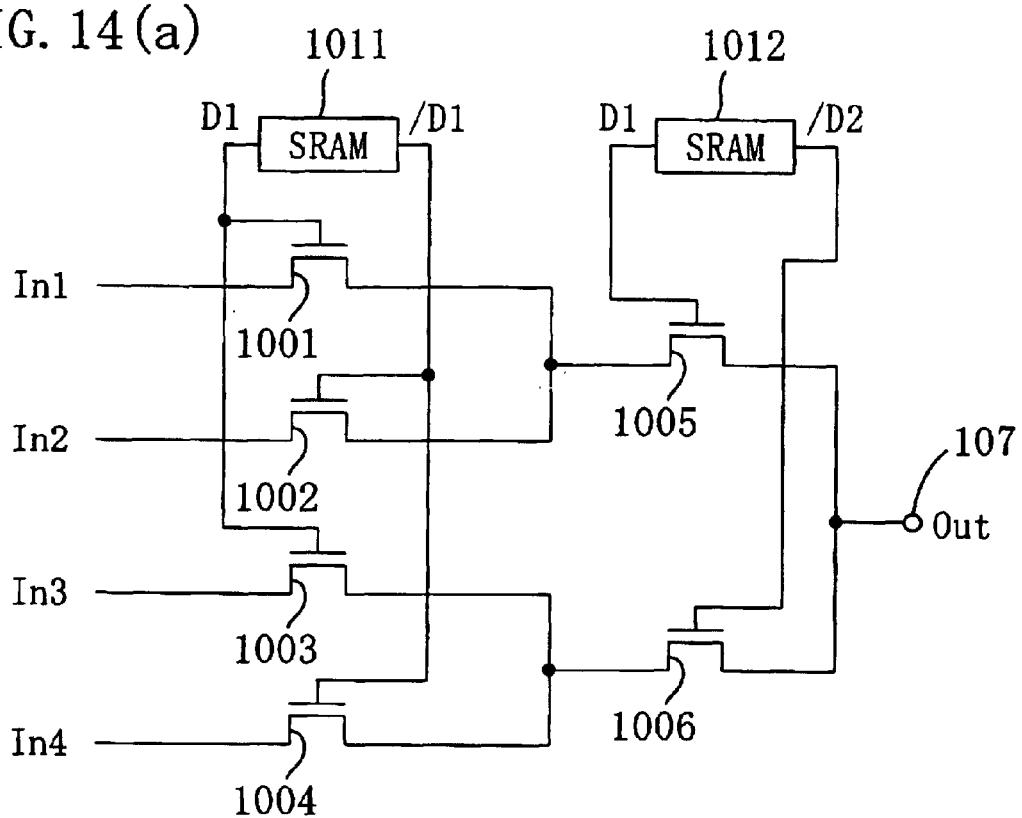
FIGS. 14(a) and 14(b) are an electric circuit diagram of a known 4-input multiplexer and a table showing the input-output relation in the multiplexer in accordance with selection signals, respectively.

FIG. 13 is a block diagram schematically illustrating the configuration of an encryption chip circuit according to an eighth embodiment.

The encryption chip of this embodiment has a matrix memory sell array and includes a data memory 301 for storing data groups, a multiplexer 302 for selecting data groups disposed in the column direction of the data memory 301, a multiplexer 303 for selecting data groups disposed in the row direction of the data memory 301, a control data memory 304, such as a ROM, for storing an encryption key, and matching circuits 305 and 306.

In the encryption chip circuit of this embodiment, according to control data that are to be an encryption key and are stored in the control data memory 304, a data group is fetched from the data memory 301 and then the fetched data group is transmitted from the multiplexers 302 and 303 to the matching circuits 305, 305 for every row and every column to determine whether or not the transmitted encrypted data is matched to the pre-retained encrypted data. In this case, the operations of the multiplexers 302 and 303 are stored in a nonvolatile state and thus encrypted-data-verifying operation requiring repetition of almost a certain procedure can be expedited.

—Other Embodiments—

In each of the foregoing embodiments, a multiplexer that selects a signal from four input signals has been described. The present invention, however, is also applicable even if the number of input signals is more than four. For example, in the case of a multiplexer that selects a signal from eight input signals, the mulitplexer may have the configuration in which four unit selectors are disposed at a stage preceding the pre-stage gate shown in FIGS. 1, 6, 7, 8, 9 and 10 so that each of the unit selectors operates according to the combinations of the logical values, 1 and 0, of three selection signals. Moreover, in the case of a multiplexer that selects a signal from two input signals, a single unit selector that operates according to the logical value, 1 or 0, of each selection signal may be located. That is to say, the foregoing embodiments are applicable to selector circuits in which the number of signals is $2^n (n \geq 2)$.

The number of input signals, however, is not necessarily $2^n$. In such a case, although some of $2^n$ FETs includes unnecessary input sections, multiplex operation can be ensured by, e.g., grounding the output section of the FET.

Furthermore, when the data input-output relation between an input terminal Ti1, Ti2, Ti3, or Ti4 and the output terminal Tout is intended to be reversed, i.e., when the four input signals shown in FIG. 4 are intended to be output from the four input terminals Ti1 though Ti4 according to data input from the output terminal Tout and the combination of logical values of selection signals D1 and D2, the input direction may be reversed. Thus, the multiplexer of each of the embodiments operates as a nonvolatile demultiplexer.

In the foregoing embodiments, when a multiplexer includes a ferroelectric capacitor and a paraelectric capacitor, the ferroelectric capacitor is used as a high-capacitance-side capacitor and the paraelectric capacitor is used as a low-capacitance-side capacitor. However, the ferroelectric capacitor may be used as a low-capacitance-side capacitor and the paraelectric capacitor may be used as a high-capacitance-side. capacitor.

It is not necessary to make all of switching sections have a nonvolatile memory function, but the configuration may be made so that only the switching section(s) that receives a common selection signal and inverted selection signal has a nonvolatile memory function. With a logic circuit such as an AND circuit, an OR circuit or a NAND circuit provided instead of the subsequent-stage gate of FIG. 1 and other figures, the configuration in which a logic operation for two signals output from the pre-stage gate is carried out may be also adopted.

According to the present invention, a selector that can store nonvolatile operating states and a semiconductor integrated circuit in which such a selector is disposed can be provided.

Industrial Applicability

A semiconductor device according to the present invention is applicable to selectors and multiplexers that are to be mounted in electronic devices, FPGAs including such a selector or multiplexer, circuits in recognition systems, circuits for encryption chips and the like.

What is claimed is:

1. A nonvolatile selector whichincludes at least one unit selector, wherein said at least one unit selector comprises a plurality of switching sections, whereine ach said switching section comprises:

a serial capacitor bank including a first capacitor and a second capacitor connected to each other in series; and a transistor that is connected to an intermediate node between the first and second capacitors and is turned ON/OFF according to the potential at the intermediate node wherein the transistors of the plurality of switching sections are connected to a common output terminal, the transistors of pluralityof switching sections are each connected to an associated one of a plurality of input terminals, the first capacitor of one said switching section A is formed of a ferroelectric capacitor, the second capacitor of the switching section A is formed of a paranonelectric capacitor or a low-capacitance capacitor, the first capacitor of another said switching section B is formed of a paranonelectric capacitor or a low-capacitance capacitor, and the second capacitor of the switching section B is formed of a ferroelectric capacitor, whereby one of the potential at the intermediate node of the switching section A and the potential at the intermediate node of the switching section B becomes the potential at which the transistor is turned OFF and the other becomes the potential at which the transistor is turned ON so that one of the plurality of input terminals connected to the transistor that has been turned ON is electrically connected with the output terminal.

2. The nonvolatile selector of claim 1, wherein the second capacitor of the switching section A is formed of a paraelectric capacitor and wherein the first capacitor of the switching section B is formed of a paraelectric capacitor.

3. The nonvolatile selector of claim 1, wherein the second capacitor of the switching section A is formed of a low-capacitance capacitor and wherein the first capacitor of the switching section B is formed of a low-capacitance capacitor.

4. The nonvolatile selector of claim 1, the nonvolatile selector comprising at least two unit selectors, wherein the first unit selector includes the plurality of switching sections, wherein the second unit selector includes a transistor connected to the intermediate node of the switching section A and a transistor connected to the intermediate node of the switching section B, wherein the transistor connected to the intermediate node of the switching section A and the transistor connected to the intermediate node of the switching section B are connected to a common output terminal, and wherein the transistor connected to the intermediate node of the switching section A and the transistor connected to the intermediate node of the switching section B are each connected to 5. The nonvolatile selector of claim 1, further comprising an output signal retaining section for retaining an output state of an output terminal in a nonvolatile state.

6. The nonvolatile selector of claim 5, wherein the output signal retaining section includes;

a serial capacitor formed of a ferroelectric capacitor and a paraelectric capacitor connected to each other via an intermediate node;

an inverter for inverting a signal output from the unit selector and then transmitting the inverted signal to the ferroelectric capacitor; and an inverter provided between the intermediate node and the output terminal.

7. The nonvolatile selector of claim 1, wherein the first capacitor of the switching section A formed of a ferroelectric capacitor and the second capacitor of the switching section B formed of a ferroelectric capacitor include respective ferroelectric films having different hysteresis of polarization depending upon applied voltages.

8. The nonvolatile selector of claim 1, wherein the first capacitor of the switching section A formed of a ferroelectric capacitor and the second capacitor of the switching section B formed of a ferroelectric capacitor include respective ferroelectric films of the same material and different thicknesses.

9. The nonvolatile selector of claim 1, wherein the first capacitor of the switching section A formed of a ferroelectric capacitor and the second capacitor of the switching section B formed of a ferroelectric capacitor include respective ferroelectric films of the same material and different areas.

10. A nonvolatile selector which includes at least one unit selector.

wherein said at least one unit selector comprises:

a serial capacitor bank including a first capacitor and a second capacitor connected to each other in series;

a first transistor that is connected to an intermediate node between the first and second capacitors and is turned ON/OFF according to the potential at the intermediate node; and a second transistor that is connected to the intermediate node and is turned ON/OFF according to the potential at the intermediate node, wherein the first and second transistors are connected to a common output terminal, the first and second transistors are each connected to an associated one of a plurality of input terminals, the first capacitor of a switching section A is formed of a ferroelectric capacitor, the second capacitor of the switching section A is formed of a paraelectric capacitor or a low-capacitance capacitor, and one of the first transistor and the second transistor is a p-channel type transistor and the other is an n-channel type transistor.

whereby the second transistor is turned OFF when the first transistor is turned ON according to the potential at the intermediate node and the second transistor is turned ON when the first transistor is turned OFF according to the potential at the intermediate node, so that one of the plurality of input terminals connected to the transistor that has been turned ON is electrically connected with the output terminal.

* * * * *

UNITED STATES PATENT AND TRADEMARK OFFICE
CERTIFICATE OF CORRECTION

PATENT NO. : 6,781,865 B2
DATED : August 24, 2004
INVENTOR(S) : Takashi Ohtsuka et al.

It is certified that error appears in the above-identified patent and that said Letters Patent is hereby corrected as shown below:

Title page,
Item [75], Inventors, change "Toyonaka (JP)" to -- Osaka (JP) --; and "Yawata (JP)" to -- Kyoto (JP) --

Column 18,
Line 12, change "whichincludes" to -- which includes --
Line 14, change "wherein ach" to -- wherein each --
Line 21, change "node wherein" to -- node, (new paragraph) wherein --
Line 24, change "of pluralityof" to -- of the plurality of --
Lines 31 and 34, change "paranonelectric" to -- paraelectric --

Column 19,
Line 6, change "each connected to" to -- each connected to an associated one of a plurality of input terminals --
Line 11, change "includes;" to -- includes: --

Column 20,
Line 4, change "selector." to -- selector, --
Lien 26, change "transistor." to -- transistor, --

Signed and Sealed this

Nineteenth Day of April, 2005

JON W. DUDAS
*Director of the United States Patent and Trademark Office*